United States Patent
Adams et al.

(10) Patent No.: US 8,213,249 B2
(45) Date of Patent: Jul. 3, 2012

(54) IMPLEMENTING LOW POWER DATA PREDICTING LOCAL EVALUATION FOR DOUBLE PUMPED ARRAYS

(75) Inventors: Chad Allen Adams, Byron, MN (US); Sharon Huertas Cesky, Rochester, MN (US); Elizabeth Lair Gerhard, Rochester, MN (US); Jeffrey Milton Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 12/788,411

(22) Filed: May 27, 2010

(65) Prior Publication Data

US 2011/0292748 A1    Dec. 1, 2011

(51) Int. Cl.
*G11C 7/00*    (2006.01)

(52) U.S. Cl. ............... 365/203; 365/201; 365/230.06

(58) Field of Classification Search ............ 365/203, 365/201, 230.06, 189.09, 207, 226, 185.25, 365/185.29, 49, 185.17, 205, 51, 63
See application file for complete search history.

(56) References Cited

U.S. PATENT DOCUMENTS 6,111,801 A * 8/2000 Brady .................... 365/201
7,313,030 B2 * 12/2007 Lohse et al. ............ 365/185.33

* cited by examiner

*Primary Examiner* — Dang Nguyen
(74) *Attorney, Agent, or Firm* — Joan Pennington

(57) ABSTRACT

A method and static random access memory (SRAM) circuit for implementing low power data predicting local evaluation for double pumped arrays, and a design structure on which the subject circuit reside are provided. A novel variation of a domino read local evaluation circuit accurately predicts the write data for the next cycle. The domino read local evaluation circuit uses static write data set up prior to a write enable signal to determine the value of the data that is being written into the array. When the data being written to the array matches the data last read the local bitlines stay in their previous state. When the data being written is opposite of the data last read then the bit lines are precharged to the precharge value.

20 Claims, 4 Drawing Sheets

IMPLEMENTING LOW POWER DATA PREDICTING LOCAL EVALUATION FOR DOUBLE PUMPED ARRAYS

FIELD OF THE INVENTION

The present invention relates generally to the data processing field, and more particularly, relates to a method and static random access memory (SRAM) circuit for implementing low power data predicting local evaluation for double pumped arrays, and a design structure on which the subject circuit resides.

DESCRIPTION OF THE RELATED ART

In a standard local evaluation for domino read SRAMs a read from the SRAM cell typically occurs through a pulldown device that discharges a global dot node. The discharge can occur for the read of a '0' or a '1' depending on the bitline being used in the evaluation circuitry. For the premise of this invention it will be assumed that the evaluation circuitry is discharging when the read of a '0' is being done. After the read occurs the global dot node is then restored to its precharged value, typically VDD, by a precharge device and corresponding precharge signal.

For the majority of local evaluations for domino read SRAMs there is no logic to keep the global dot node from discharging whenever the true local bitline discharges. This results in discharging and precharging the global dot node with each read or write of a zero '0' to the SRAM cell.

In the case of double pumped arrays, which typically perform two operations within a given cycle, the precharging of the local bitline and global dot node can be somewhat problematic and power intensive. The power usage is especially important considering that precharge drivers are often the largest devices within the array.

If one were able to accurately predict the value that is being written into the array prior to the write occurring it would be possible to keep both signals in a discharged state if the data being written matches what was read. This would provide a substantial power savings for any double pumped design due to the decrease in the number of devices switching for a given operation.

SUMMARY OF THE INVENTION

Principal aspects of the present invention are to provide a method and static random access memory (SRAM) circuit for implementing low power data predicting local evaluation for double pumped arrays, and a design structure on which the subject circuit resides. Other important aspects of the present invention are to provide such method, circuitry, and design structure substantially without negative effect and that overcome many of the disadvantages of prior art arrangements.

In brief, a method and static random access memory (SRAM) circuit for implementing low power data predicting local evaluation for double pumped arrays, and a design structure on which the subject circuit reside are provided. A novel variation of a domino read local evaluation circuit accurately predicts the write data for the next cycle. The domino read local evaluation circuit uses static write data set up prior to a write enable signal to determine the value of the data that is being written into the array. When the data being written to the array matches the data last read, the local bitlines stay in their previous state. When the data being written is opposite of the data last read, both bit lines are precharged to the precharge value.

In accordance with features of the invention, a pulse width of a precharge signal applied to the domino read local evaluation circuit and down stream logic has a sufficient pulse width to encompass both the read and write operations. This is a change to standard double pump operation which would require the precharge signal to turn on and off for both operations.

In accordance with features of the invention, power usage for precharging of the local bitline and global dot node for double pumped arrays which perform two operations within a given cycle is substantially reduced due to the decrease in the number of devices switching for a given operation.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a method and static random access memory (SRAM) circuits for implementing low power data predicting local evaluation for double pumped arrays, and a design structure on which the subject circuit reside are provided.

In accordance with features of the invention, a novel variation of a domino read local evaluation circuit accurately predicts the write data for the next cycle, and provides substantial power savings for any double pumped design due to the decrease in the number of devices switching for a given operation. The domino read local evaluation circuit uses static write data set up prior to a write enable signal to determine the value of the data that is being written into the array. When the data being written to the array matches the data last read the local bitlines stay in their previous state. When the data being written is opposite of the data last read both bit lines are precharged to their precharge value and the write driver discharges the bitlines for the data being written.

Figure 1:
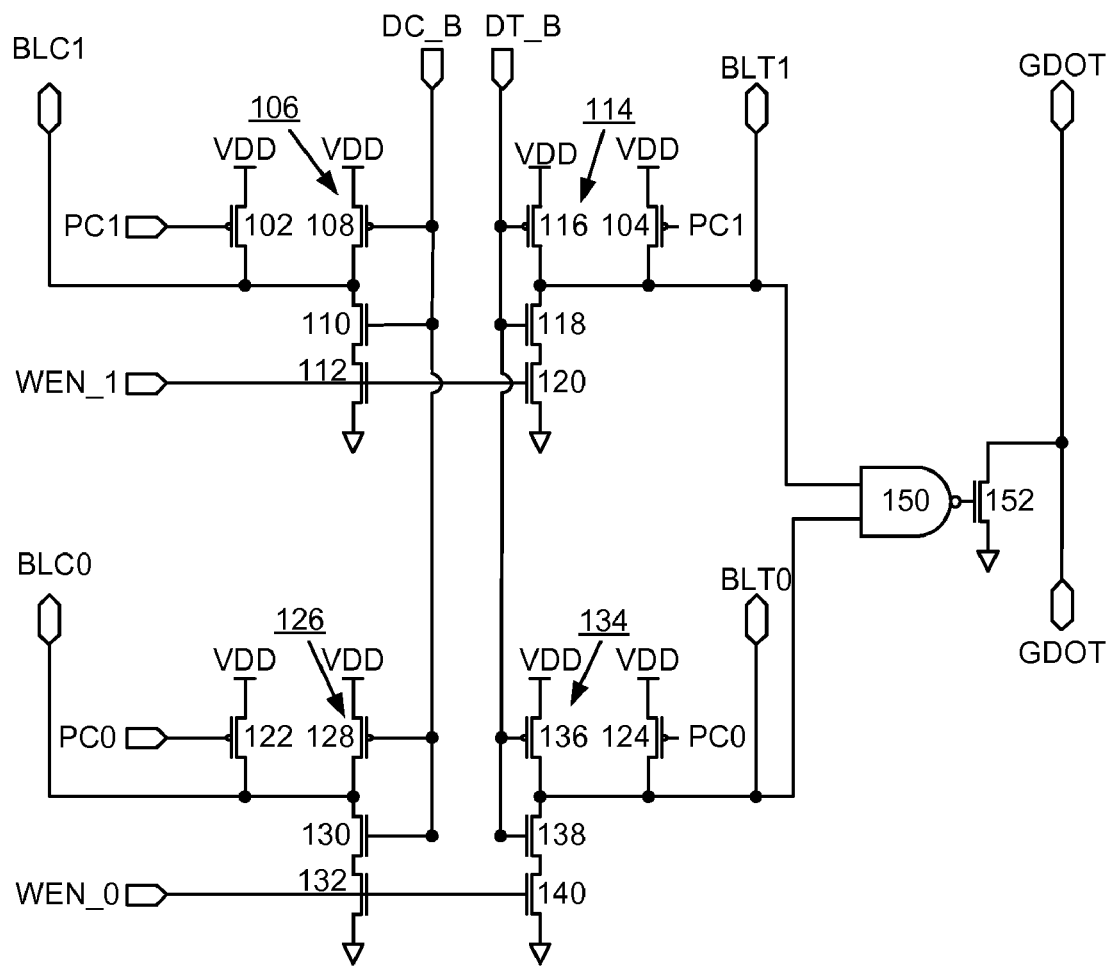
FIG. 1 is a schematic diagram of an exemplary static random access memory (SRAM) local evaluation circuit for implementing low power data predicting local evaluation for double pumped arrays in accordance with the preferred embodiment.

Having reference now to the drawings, in FIG. 1, there is shown an exemplary static random access memory (SRAM) local evaluation circuit for implementing low power data predicting local evaluation for double pumped arrays generally designated by the reference character 100 in accordance with the preferred embodiment.

SRAM low power data predicting local evaluation circuit 100 includes a first pair of precharge devices or P-channel field effect transistors (PFETs) 102, 104 connected between a voltage supply rail VDD and a respective a local bit line pair, BLC1, BLT1 with a respective active low gate input PC1.

SRAM low power data predicting local evaluation circuit 100 includes a complement write data transistor stack 106 receiving a complement write data set up input DC_B and connected between the voltage supply rail VDD and ground including a PFET 108 connected to the voltage supply rail VDD, and a series connected pair of N-channel field effect transistors (NFETs) 110, 112. The PFET 108 and NFET 110 include a junction connection to the complement local bit line BLC1 and have a complement write data set up gate input DC_B. The NFET 112 has a write enable input WEN_1.

SRAM low power data predicting local evaluation circuit 100 includes a write data transistor stack 114 receiving a true write data set up gate input DT_B and connected between the voltage supply rail VDD and ground including a PFET 116 connected to the voltage supply rail VDD, and a series connected pair of N-channel field effect transistors (NFETs) 118, 120. The PFET 116 and NFET 118 include a junction connection to the true local bit line BLT1 and have a write data set up gate input DT_B. The NFET 120 has a write enable input WEN_1.

SRAM low power data predicting local evaluation circuit 100 includes a second SRAM cell pair of precharge devices or P-channel field effect transistors (PFETs) 122, 124 connected between a voltage supply rail VDD and a respective a local bit line pair, BLC0, BLT0 with a respective active low gate input PC0.

SRAM low power data predicting local evaluation circuit 100 includes a complement write data transistor stack 126 receiving the complement write data set up input DC_B and connected between the voltage supply rail VDD and ground including a PFET 128 connected to the voltage supply rail VDD, and a series connected pair of N-channel field effect transistors (NFETs) 130, 132. The PFET 128 and NFET 130 include a junction connection to the complement local bit line BLC0 and have gate input of the complement write data set up DC_B. The NFET 132 has a gate input of a write enable input WEN_0.

SRAM low power data predicting local evaluation circuit 100 includes a true write data transistor stack 134 receiving the true write data set up gate input DT_B and connected between the voltage supply rail VDD and ground including a PFET 136 connected to the voltage supply rail VDD, and a series connected pair of N-channel field effect transistors (NFETs) 138, 140. The PFET 136 and NFET 138 include a junction connection to the true local bit line BLT0 and have a gate input of write data set up DT_B. The NFET 140 has a gate input of the write enable input WEN_0.

SRAM low power data predicting local evaluation circuit 100 includes read devices of a two-input NAND gate 150 coupled to the bitlines BLT0, BLT1 and an NFET 152 connected between a global dot line (GDOT) and ground. The output of NAND gate 150 is applied to the gate of NFET 152 driving the global dot line GDOT.

Figure 2:
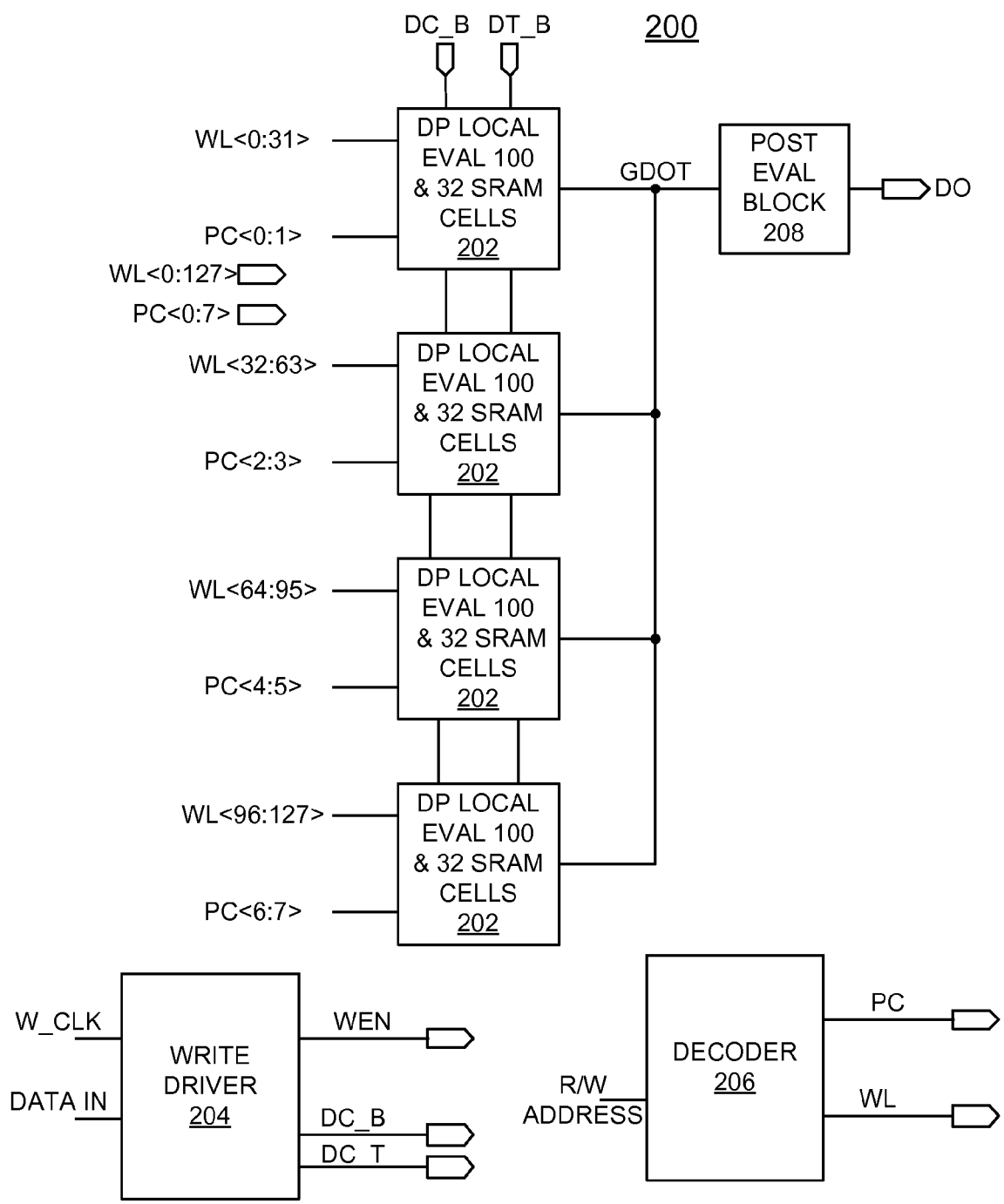
FIG. 2 is a schematic diagram illustrating an exemplary static random access memory (SRAM) circuit including the local evaluation circuit of FIG. 1 for implementing low power data predicting local evaluation for double pumped arrays in accordance with the preferred embodiment.

Referring also to FIG. 2, there is shown an example Domino read SRAM circuit generally designated by the reference character 200 in accordance with the preferred embodiment. Domino read SRAM 200 includes a respective low power data predicting (DP) local evaluation circuit 100 with each of a plurality of groups 202 of 32 SRAM cells with each of the bit line pairs BLC0, BLT0 and BLC1, BLT1 feeding a group of 16 cells, with only one bit line pair BLC0, BLT0 or bit line pair BLC1, BLT1 active at a time. Domino read SRAM 200 includes a write driver 204 receiving a data input DATA IN and a write clock W_CLK and providing the write enable signal WEN and the true and complement write set up signals DT_B, DC_B applied to the low power DP local evaluation circuit 100. Domino read SRAM 200 includes a decoder 206 receiving a read/write (R/W) address input and providing signals, precharge PC and wordline WL. The global dot line GDOT of the DP local evaluation circuit 100 for each of the 32 SRAM cells groups 200 is applied to a post evaluation block 208 providing an output DO.

Figure 3:
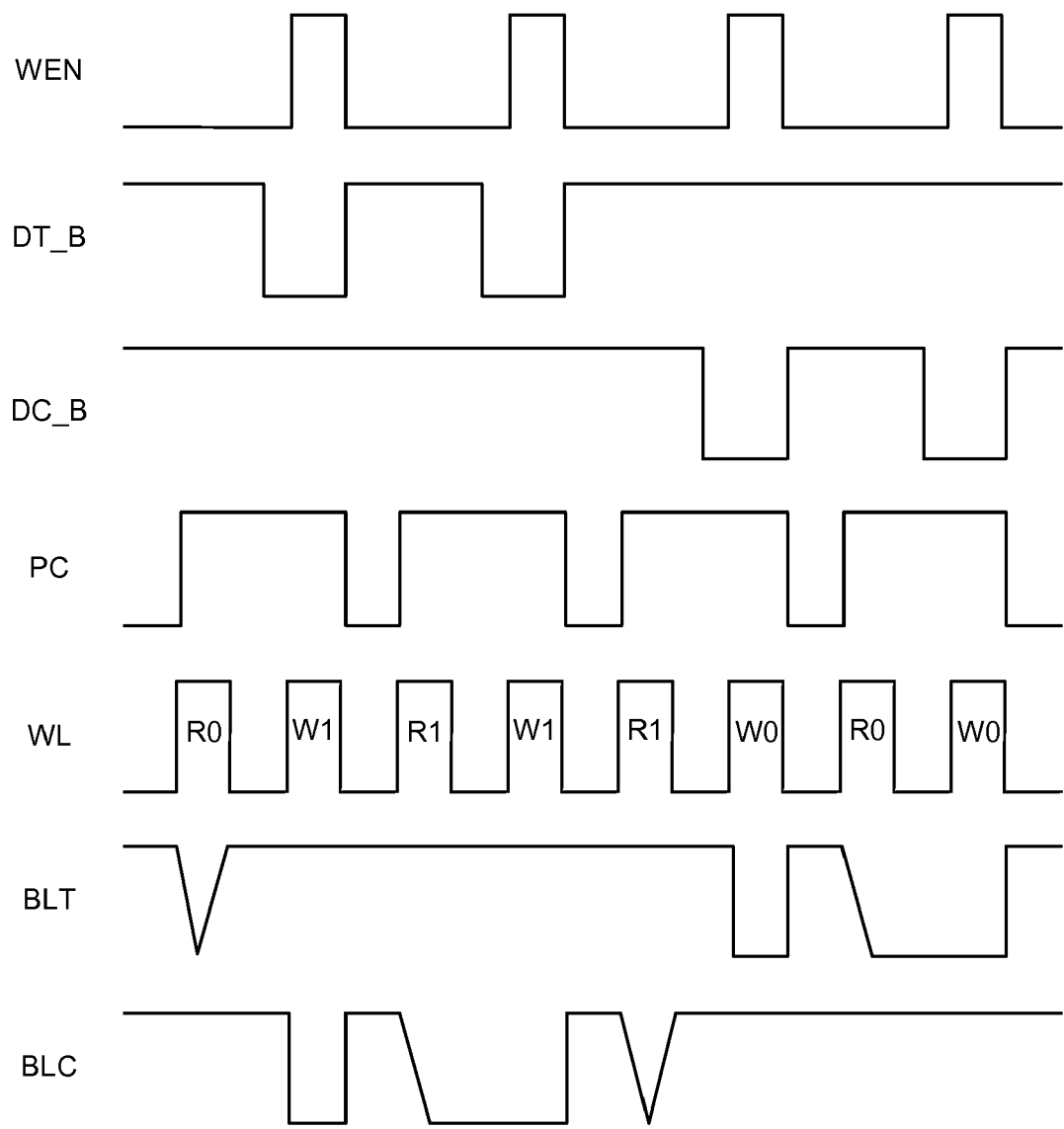
FIG. 3 is a timing diagram illustrating example operations of the circuits of FIGS. 1 and 2 for implementing low power data predicting local evaluation for double pumped arrays in accordance with the preferred embodiment.

Referring also to FIG. 3, there is shown a timing diagram illustrating example operations of the circuits 100 and 200 of FIGS. 1 and 2 for implementing low power data predicting local evaluation for double pumped arrays in accordance with the preferred embodiment.

The operation of SRAM low power data predicting local evaluation circuit 100 refers to bit line pair BLC1, BLT1, since the logic and device structure are identical between the bit line pairs BLC0, BLT0 and BLC1, BLT1.

The write enable signal WEN, the true and complement write set up signals DT_B, DC_B, provided by the write driver 204 and the precharge signal PC provided by the decoder 206 are applied to the low power DP local evaluation circuit 100. The true and complement write set up signals DT_B, DC_B are applied to the gates of the respective PFET 108, NFET 110, and PFET 116, NFET 118 of complement and true SRAM write device stacks 106, 114 and are held high when the array is not being accessed or during the read operation. One of the true or complement write set up signals DT_B, DC_B is driven low to turn on or activate either the PFET 108 or the PFET 116 before the write enable signal WEN is activated, and precharge the corresponding true or complement bit line BLC1 to the voltage supply rail VDD. The write enable signal WEN is applied to the gate of the respective NFET 112 and NFET 120 of the complement and true SRAM write device stacks 106, 114 to write the SRAM cell and is driven high for the write operation and the opposite true or complement bit line is discharge to ground.

By re-enforcing the values corresponding true or complement bit line BLT1 or BLC1 from the read, the switching power of the array is reduced by approximately one-half over the conventional arrangements where both bit lines are precharged between the read and write operations.

Typically precharge devices hold the local bit lines at a known voltage, such as VDD, when the SRAM cell is not being accessed and the signal controlling the precharge devices is typically an active low signal and will toggle high when a given SRAM cell on that group of 16 is being accessed.

The precharge signal in accordance with the invention is an active low signal that has a high pulse width between a read and write operation. In standard double pump arrays it is necessary to precharge the local bit lines between the two operations without knowledge of the data being written to the array.

With the respective PFET 108, NFET 110, and PFET 116, NFET 118 of complement and true SRAM write device stacks 106, 114 together with the input signals DC_B and DT_B, the precharge devices PFETs 102, 104 receive the precharge signal PC as shown in FIG. 3 and remain off between the read and write operations, with the local bits lines only being precharged if the data being written is opposite of what was just read.

For example, when writing a one '1' after the read of a zero '0', the signal DT_B is driven low while DC_B remains high. The true write set up signal DT_B going low activates PFET 116 and pulls true bit line BLT1 to the voltage supply rail VDD. When write enable signal WEN_1 goes high, NFET 112 is turned on, which discharges the complement bit line BLC1 node through devices NFETS 110, 112.

For example, when writing a zero '0' after the read of a one '1' has occurred, the signal DC_B is driven low while DT_B remains high. The complement write set up signal DC_B going low activates PFET 108 and pulls complement bit line BLC1 to the voltage supply rail VDD. When write enable signal WEN_1 goes high, NFET 120 is turned on, which discharges the true bit line BLT1 node through devices NFETS 118, 120.

Figure 4:
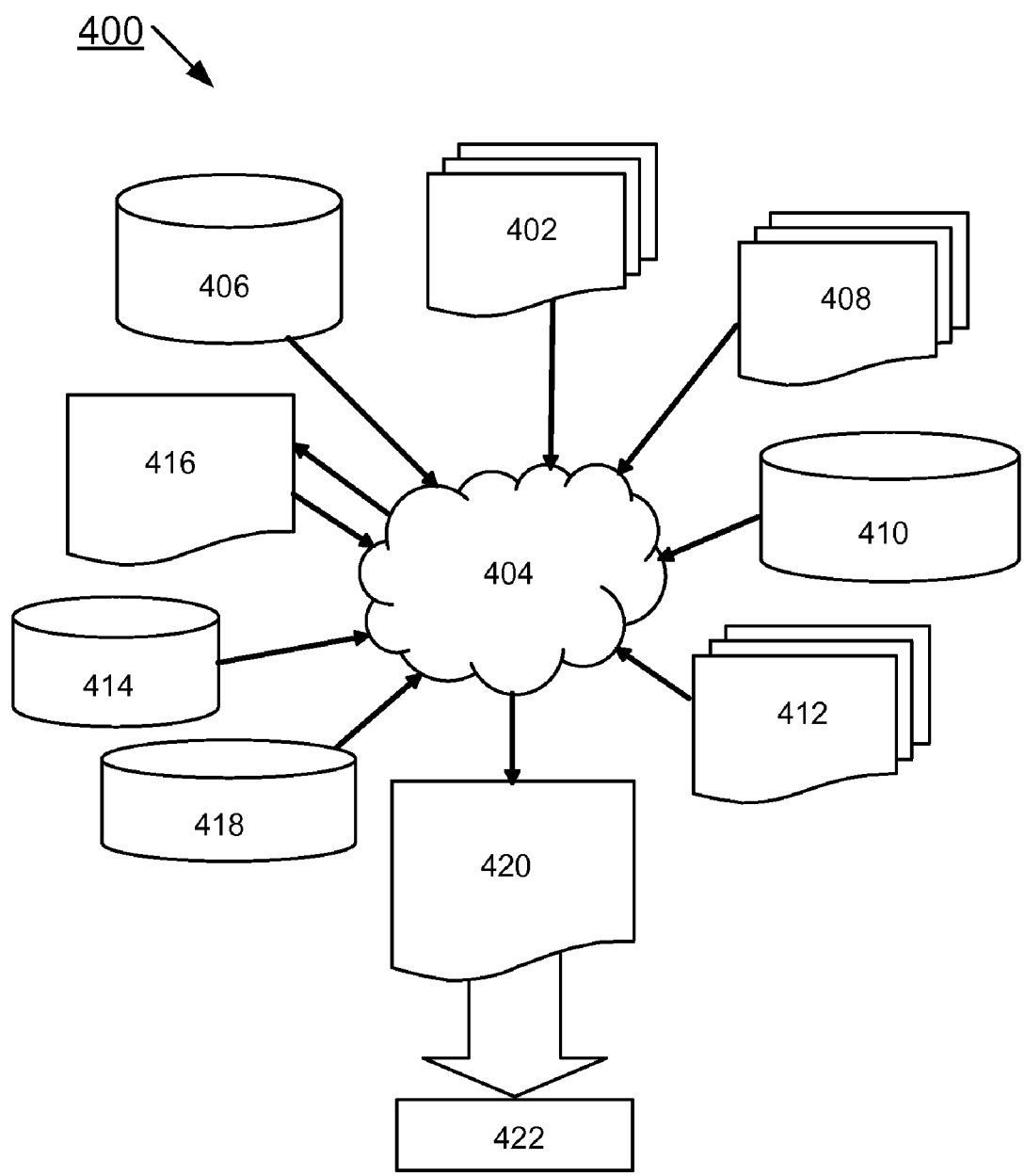
FIG. 4 is a flow diagram of a design process used in semiconductor design, manufacturing, and/or test.

FIG. 4 shows a block diagram of an example design flow 600 that may be used for circuits 100 and 200 as described herein. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuits 100, 200 in the form of schematics or HDL, a hardware-description language, for example, Verilog, VHDL, C, and the like. Design structure 402 may be contained on one or more machine readable medium. For example, design structure 402 may be a text file or a graphical representation of circuits 102, 200. Design process 404 preferably synthesizes, or translates, circuits 100, 200 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuits.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information. Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 1-3 along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-3. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing low power data predicting local evaluation in static random access memory (SRAM) for double pumped arrays, said SRAM including true and complement local bit lines comprising:
   determining the value of the data being written into the array;
   comparing the data being written to the array with the data last read;
   responsive to the data being written matching the data last read, maintaining the true and complement local bitlines in a current state; and
   responsive to the data being written being opposite of the data last read, precharging the true and complement local bit lines to a precharge value.

2. The method as recited in claim 1 wherein determining the value of the data being written into the array and comparing the data being written to the array with the data last read includes providing static write data set up signals prior to a write enable signal.

3. The method as recited in claim 1 includes providing first precharge devices coupled to the true and complement local bit lines, and providing an active low precharge signal having a high pulse width to hold said first precharge devices off during the read and write operations for the double pumped arrays.

4. The method as recited in claim 1 includes providing true and complement static write data set up signals applied to true and complement SRAM write devices coupled to true and complement local bit lines; said true and complement static write data set up signals being held high during the read operation.

5. The method as recited in claim 4 includes driving low one of said true and complement static write data set up signals applied to true and complement SRAM write devices prior to activating a write enable signal.

6. The method as recited in claim 5 includes activating said write enable signal, and discharging the local bit line connected to an opposite one of true and complement SRAM write devices.

7. A circuit for implementing low power data predicting local evaluation for double pumped arrays of static random access memory (SRAM) including true and complement local bit lines, said circuit comprising:
   true and complement SRAM write devices coupled to the true and complement local bit lines;
   a write driver receiving a data input, determining the value of the data being written into the array; comparing the data being written to the array with the data last read; and providing respective true and complement static write data set up signals applied to said respective true and complement SRAM write devices prior to activating a write enable signal;
   said true and complement SRAM write devices maintaining the true and complement local bitlines in a current state responsive to the data being written matching the data last read; and
   said true and complement SRAM write devices precharging the true and complement local bit lines to a precharge value, responsive to the data being written being opposite of the data last read.

8. The circuit as recited in claim 7 includes a pair of precharge devices coupled to respective true and complement local bit lines, an active low precharge signal having a high pulse width to hold said first precharge devices off during the read and write operations for the double pumped arrays.

9. The circuit as recited in claim 7 wherein said write driver provides said true and complement static write data set up signals being held high during the read operation.

10. The circuit as recited in claim 7 wherein said true and complement SRAM write devices coupled to the respective true and complement local bit lines include a respective transistor stack receiving a respective one of said true and complement static write data set up signals and connected between a voltage supply rail and ground.

11. The circuit as recited in claim 10 wherein each said respective transistor stack includes a P-channel field effect transistor (PFET) connected between said voltage supply rail VDD, and a series connected pair of N-channel field effect transistors (NFETs).

12. The circuit as recited in claim 11 wherein a junction connection of said PFET and a first NFET of said series connected pair of NFETs is connected to the respective one of the true and complement local bit lines.

13. The circuit as recited in claim 12 wherein each of said PFET and said first NFET of said series connected pair of NFETs has a gate input receiving said respective one of said true and complement static write data set up signals.

14. The circuit as recited in claim 10 wherein a second NFET of said series connected pair of NFETs has a gate input receiving said write enable signal.

15. The circuit as recited in claim 14 includes said write driver drives low one of said true and complement static write data set up signals applied to said respective PFET of true and complement SRAM write devices prior to activating a write enable signal, and activating said write enable signal, and activating said second NFET of an opposite one of true and complement SRAM write devices, discharging the corresponding local bit line.

16. A design structure embodied in a machine readable medium used in a design process, the design structure comprising:

a circuit tangibly embodied in the machine readable medium used in the design process, said circuit for implementing low power data predicting local evaluation for double pumped arrays of static random access memory (SRAM) including true and complement local bit lines, said circuit comprising:

true and complement SRAM write devices coupled to the true and complement local bit lines;

a write driver receiving a data input, determining the value of the data being written into the array; comparing the data being written to the array with the data last read; and providing respective true and complement static write data set up signals applied to said respective true and complement SRAM write devices prior to activating a write enable signal;

said true and complement SRAM write devices maintaining the true and complement local bitlines in a current state responsive to the data being written matching the data last read; and said true and complement SRAM write devices precharging the true and complement local bit lines to a precharge value, responsive to the data being written being opposite of the data last read, wherein the design structure, when read and used in the manufacture of a semiconductor chip produces a chip comprising said circuit.

17. The design structure of claim 16, wherein the design structure comprises a netlist, which describes said circuit.

18. The design structure of claim 16, wherein the design structure resides on storage medium as a data format used for the exchange of layout data of integrated circuits.

19. The design structure of claim 16, wherein the design structure includes at least one of test data files, characterization data, verification data, or design specifications.

20. The design structure of claim 16, wherein said circuit includes pair of precharge devices coupled to respective true and complement local bit lines, an active low precharge signal having a high pulse width to hold said first precharge devices off during the read and write operations for the double pumped arrays.

* * * * *